April 4, 1950 A. W. PLENSLER 2,503,066

TUNING CONTROL APPARATUS

Filed March 2, 1946 2 Sheets-Sheet 1

INVENTOR.
Alexander W. Plensler,
BY Mueller and Mason
Att'ys.

April 4, 1950 A. W. PLENSLER 2,503,066

TUNING CONTROL APPARATUS

Filed March 2, 1946 2 Sheets-Sheet 2

INVENTOR.
Alexander W. Plensler,
BY Mueller and Mason
Attys.

Patented Apr. 4, 1950 2,503,066

UNITED STATES PATENT OFFICE 2,503,066

TUNING CONTROL APPARATUS

Alexander W. Plensler, Chicago, Ill., assignor to Belmont Radio Corporation, Chicago, Ill., a corporation of Illinois Application March 2, 1946, Serial No. 651,635

13 Claims. (Cl. 74—10.33)

The present invention relates to an improved control apparatus and more particularly to automatic tuning apparatus of the mechanical type for use in selectively tuning a radio receiving set to desired signal channels. Specifically, the present invention is an improvement on U. S. Letters Patents 2,266,709, 2,266,710, 2,266,711 and 2,301,141, all assigned to the same assignee as the present application.

Various push button actuated mechanical control devices are commercially available for selectively controlling the tuning elements of radio receivers. A device of this character conventionally includes a number of push button actuated selector structures, each of which correspond to different signal channels. The selector structures cooperate with a treadle or linkage mechanism disposed within the radio receiver to selectively control the tuning element in accordance with the particular push button actuated. In order that a few push button or selector units can be adapted to tune or control a large number of predetermined station frequencies mechanical tuning mechanisms of the prior art have been provided with means for making a relative adjustment or setting of the selector unit so that each unit may tune more than one station frequency, depending upon the particular setting. Obviously only one frequency can be tuned in for each setting, but various settings are obtained from various adjustments thereof.

The automatic tuning mechanisms of the prior art such, for example, as are disclosed in the above-mentioned patents, generally included friction means of various sorts to hold, lock or retain the adjustable element of each selector unit in a predetermined position. In all of the disclosures of the above-mentioned patents means are provided so that the adjustment of any selector unit can be made without the use of additional tools and merely by a particular actuation of the push button itself. This is necessary since the push buttons must be arranged close together in order to minimize the space which they occupy in a radio receiver. It would be desirable, in order that the radio receiving sets can be manufactured at low cost, that such mechanical tuning mechanisms are constructed as simply as possible, preferable from die stampings, and are arranged for easy assembly while at the same time being positive and reliable in operation.

In some of the prior art automatic tuning type of control apparatus it has been found that premature locking of the adjustable or settable device has occurred so that it is locked before the final adjustment is made. In order to avoid this in prior art devices critical adjustments have been necessary between spring pressures and the friction afforded by friction washers and the like.

Accordingly it is an object of the present invention to provide a new and improved control apparatus which overcomes the undesirable features of prior art devices mentioned above.

It is another object of the present invention to provide an improved push button actuated selector unit of the character described which is simple and sturdy in construction, includes a small number of parts, all of which may be formed by a single stamping operation, may be easily assembled and includes an adjustable portion which may be clamped in an adjusted position only at the desired time and without the use of supplementary tools or the like.

Still another object of the present invention is to provide an improved selector unit of the character described including an adjustable member which is adapted to be retained or locked by frictional means in a predetermined position which includes means to prevent premature locking during an adjusting operation.

Still a further object of the present invention is to provide a new and improved arrangement of a radio tuning apparatus having adjustable elements on the selector units therefor and frictional locking means for the adjustable elements operated simply through a push or pull movement by a single hand of the operator.

Further objects and advantages of the present invention will become apparent as the following description proceeds and the features of novelty which characterize the present invention will be pointed out with particularity in the claims annexed to and forming a part of this specification.

For a better understanding of the present invention reference may be had to the accompanying drawings in which.

Figure 1:
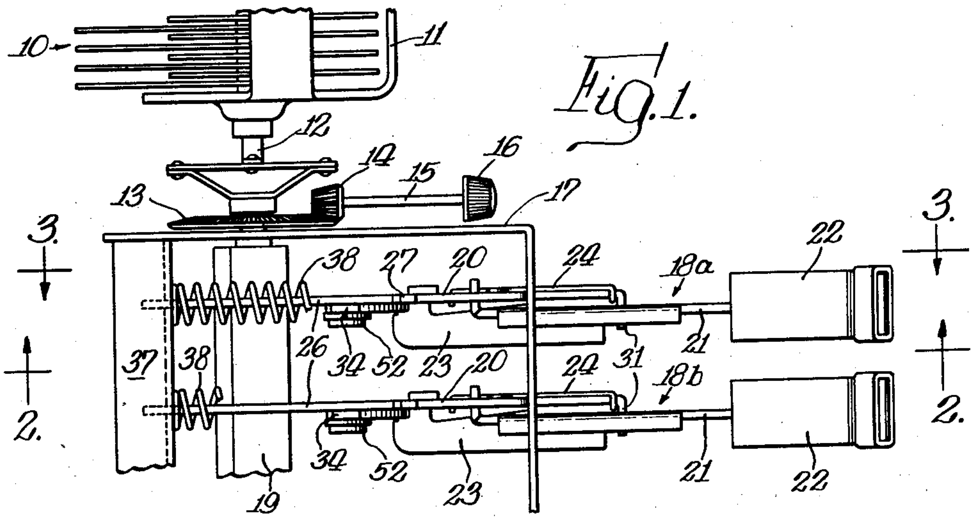
Fig. 1 is a fragmentary plan view of the tuner structure of a radio receiving apparatus embodying the present invention.

Referring now to the drawings and more particularly to Fig. 1 thereof, the improved control apparatus is illustrated in its embodiment in a radio receiver for the purpose of adjusting the resonant frequency changing elements which are utilized in a well-known manner to tune the radio receiver to different signal channels. It will be understood that the resonant frequency changing means could be a variable capacitor as indicated in Patent No. 2,266,711 mentioned above, or a variable inductance as illustrated in Patent No. 2,266,710 mentioned above. As illustrated in the drawings the frequency changing means of the receiver may comprise a tuning condenser 10 having a fixed frame 11 and a rotatable shaft 12 which carries the rotor plates of the condenser and is rotatable through 180° to provide the full tuning range for the receiver. Condenser 10 is suitably electrically connected into the circuit of the radio receiver in a manner well understood by those skilled in the art.

The shaft 12 is preferably provided with a gear segment 13 which meshes with a pinion 14 mounted at the end of a tuning shaft 15. Rotation of the shaft 15 by turning manually engageable tuning knob 16, tunes the condenser 10 to a given frequency in an obvious manner whereby various broadcasting stations may be tuned in on the radio receiver in accordance with the will of the listener. Normally an appropriate tuning scale, not shown, is provided to indicate the position of shaft 12 and the rotor plates of condenser 10 in a well-known manner. It is contemplated that the teeth of the gear segment 13 and of the pinion 14 be of the V-type so as to reduce to a minimum the occurrence of any back lash therebetween whereby accurate tuning by the push button selector units to be described hereinafter can be obtained.

The tuning shaft 12 is suitably journalled in a frame member 17 which is rigidly mounted in any suitable manner upon the chassis of the radio reeciver.

Rotary movement may be imparted to tuning shaft 12 either through operation of knob actuated shaft 15 or through the selective operation of any one of a plurality of push button actuated selector units generally indicated at 18*a*, 18*b*, etc. Although only two push button selector units are illustrated in Fig. 1 it will be understood that any reasonable desired number of push button selector units may be employed.

Figure 2:
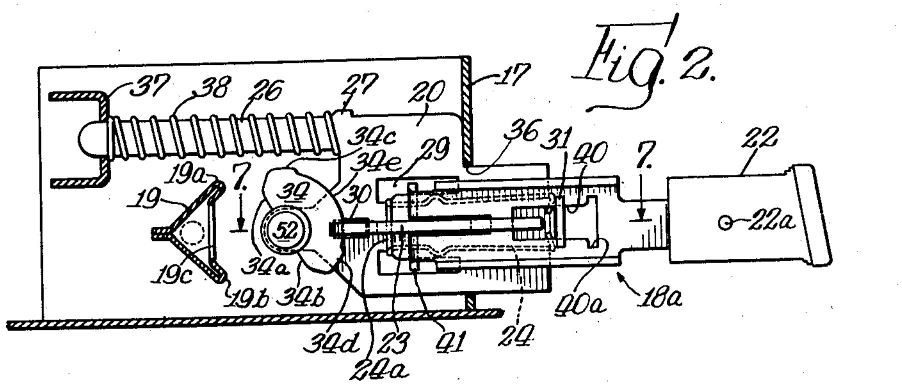
Fig. 2 is a sectional view taken on line 2—2 of Fig. 1.
Figure 3:
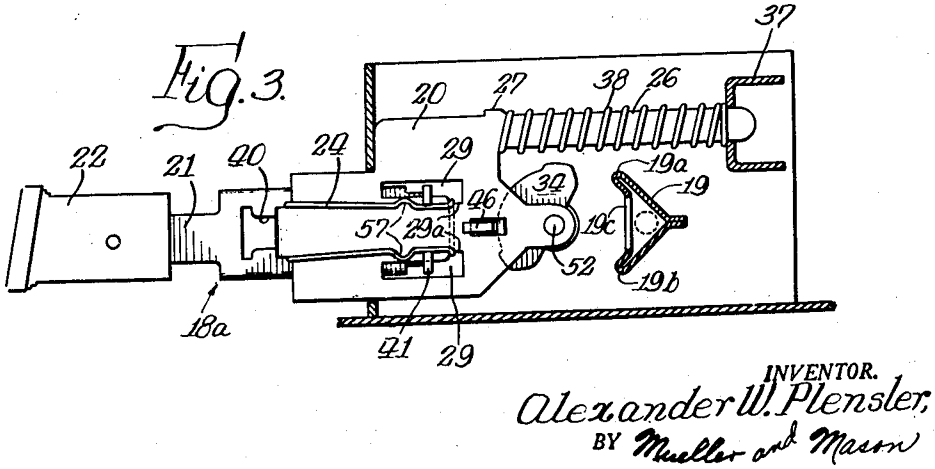
Fig. 3 is a sectional view taken on line 3—3 of Fig. 1.

In order that tuning shaft 12 may be rotated in response to operation of one of the selector units 18*a*, 18*b* or the like, tuning shaft 12 is preferably provided with a treadle bar or member 19. The treadle bar or rotary control means 19, as shown in Fig. 2, is of one-piece hollow construction and is substantially V-shaped in cross section, the adjacent angle or engaging portions 19*a* and 19*b* being connected by an integral slotted portion 19*c*. Treadle bar 19 is, of course, rotatable with shaft 12 and is actuable by the selector units such as 18*a*, 18*b* or the like in a manner which will become apparent as the following description proceeds.

Since the push button actuated selector units such as 18*a* and 18*b* are of identical construction only one selector unit such as 18*a* will be described in detail, but the corresponding parts of all of the various selector units shown in Fig. 1 will be designated by the same reference numerals. Selector unit 18*a* comprises a carriage or supporting member 20 which is slidably mounted and consequently may be characterized as the main slide member to distinguish it from other slidable members to be described hereinafter. Selector unit 18*a* also includes in addition to carriage 20, a linearly movable actuating member or slidable member 21, a push button 22 fastened to one end of the slidable member 21, as by a pin 22*a*, a frictional locking member 23 and a premature locking preventing means 24. More specifically, the carriage member 20 is of flat, irregular shape best shown in Fig. 10, and is integrally formed with a body portion 25 and an extending finger portion 26, the inner end of the finger 26 being defined by a projecting shoulder 27 and a side 28 of the main body portion 25. The main body portion 25 is also provided substantially centrally thereof with inwardly facing L-shaped apertures 29 and an additional aperture 30 positioned between the apertures 29 near one end thereof. A bent portion 31 of substantially T-shape is formed at the end 32 of the body portion 25. The opposite end of body portion 25 is provided with an opening 33 for an adjustable or settable member or cam 34 which will be described in greater detail hereinafter. Carriage 20 is also provided with a shoulder 35 which acts as a stop member, limiting movement in one direction in a manner to be described hereinafter. Carriage or main slide member 20 is mounted for slidable movement in frame 17, a suitable opening 36 being provided therein. The finger 26 of carriage or main slide member 20 is adapted to be supported in a bracket member 37 suitably mounted with respect to frame member 17. A coil spring 38 mounted on finger 26 is compressed between bracket 37 on one end and shoulder 27 and slide 28 of carriage 20 so as to bias carriage 20 to the right as viewed in Fig. 2 with the stop portion 35 engaging frame 17. If desired a suitable cushioning means or bumper, not shown, may be provided on frame 17 to cushion the engagement of shoulder 35 with frame member 17 when carriage 20 is moved to the right under the influence of spring 38.

Figures 8, 9, 10:
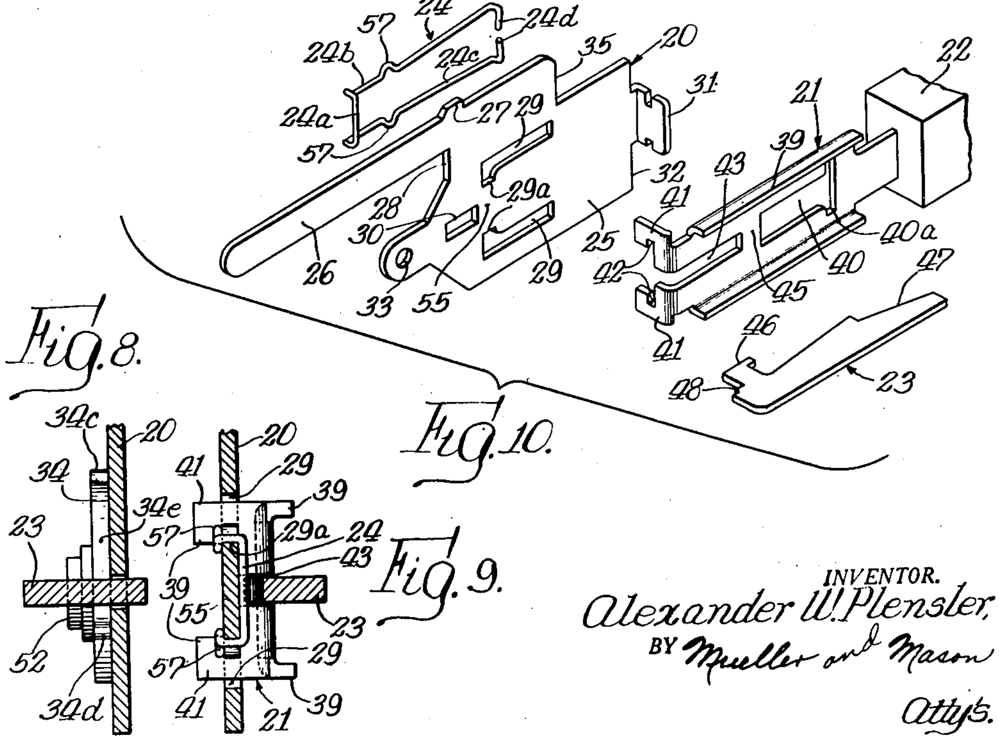
Fig. 8 is a sectional view taken on line 8—8 of Fig. 4.
Fig. 9 is a sectional view taken on line 9—9 of Fig. 4.
Fig. 10 is an exploded perspective view of some of the elements of the selector unit.

Slidable actuating member 21 also best shown in Fig. 10 is of substantially flat shape and is provided near the edges thereof with bent or flanged portions 39. Between flanges 39 there is provided a substantially T-shaped aperture 40. Bent in a direction oppositely from flanges 39 but at the end of actuating member 21, remote from push button 22, there is provided a substantially U-shaped portion with legs 41 having recesses 42 formed on the inner sides thereof so as to cooperate readily with L-shaped openings 29 in carriage 20. The end of actuating member 21 adjacent U-shaped members 41, is bifurcated, as indicated at 43, so as to define a web member 45 between aperture 40 and bifurcation 43.

Locking member 23 also best shown in Fig. 10 is a substantially L-shaped member having a hook portion 46 at one end thereof and a tapered camming portion 47 at the other end. Near the hook-shaped portion 46 there is provided a shoulder portion 48 for frictionally engaging with the adjustable or settable cam member 34. The hook portion 46 is adapted for insertion in aperture 30 of carriage member 20 so that L-shaped locking member 23 may be hooked in aperture 30 with the cam end 47 movable toward and away from carriage 20 by pivoting about hook-shaped portion 46.

Figure 6:
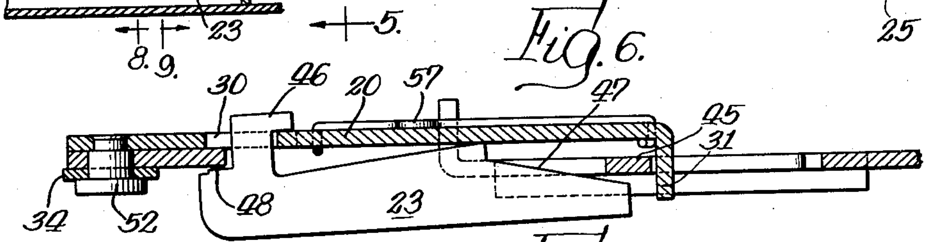
Fig. 6 is a sectional view taken on line 6—6 of Fig. 4.
Figure 7:
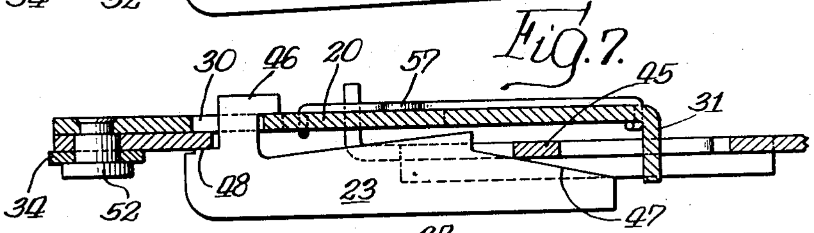
Fig. 7 is a sectional view similar to Fig. 6 but taken on line 7—7 of Fig. 2.

In the assembly of the selector unit the actuating member 21 is slidably mounted on carriage 20, the leg portions 41 being initially inserted in the portions 29a of L-shaped apertures 29 of carriage 20 whereupon the leg portions 41 are in dovetailed engagement with the carriage member 20 in an obvious manner. The T-shaped portion 31 of carriage member 20 is also dovetailed with the edges of aperture 40 in slidable member 21, the T-shaped member 31 being initially inserted in the portion 40a of aperture 40. This dovetailed engagement which is clearly shown in Figs. 1, 6 and 7, provides for a relative longitudinal movement of members 20 and 21 so that each selector unit 18a and 18b, etc. may be extended and contracted, yet without permitting the members 20 and 21 to become disengaged except at the initial assembling position just described.

The cam 34 previously mentioned, is pivotally mounted on a pin 52 which is journalled in the aperture 33 of carriage 20. This cam is relatively narrow and of semi-circular section, having flat portions 34a and 34b arranged on opposite sides of the pivot pin 52. Abutments 34c and 34d formed at each end of the arcuate portion 34e of cam 34 serve to limit the pivotal movement of the cam about the pin 52 by engagement with locking member 23. Cam 34 is adapted to engage with rotatable control means or treadle bar 19 to cause a predetermined positioning of the latter in dependence upon the predetermined position of cam 34 relative to carriage 20.

Figure 4:
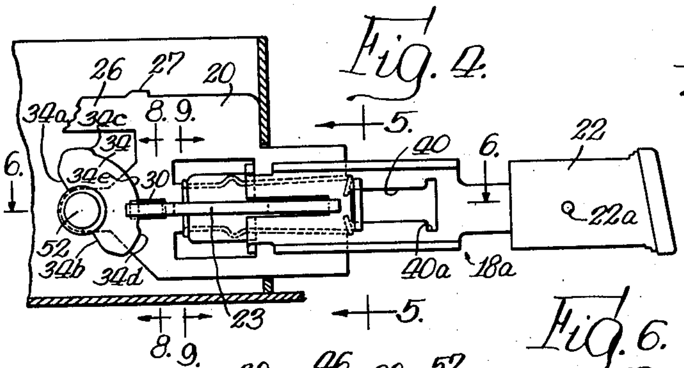
Fig. 4 is a sectional view similar to Fig. 2 with the selector unit parts arranged in the position which they assume prior to its adjustment for a particular tuning condition.

With the arrangement thus far described, the carriage 20 is initially assembled in the frame 17 with compression or normalizing spring 38 being slipped over finger 26. The carriage is inserted until shoulder 35 engages with frame 17. The slidable actuating member 21 can then be inserted as described above, a push button 22 of suitable insulating material or the like, having been fastened to the outwardly extending end of member 21. The locking member 23 may then be positioned with its hook-shaped portion 40 inserted in aperture 30 while the members 20 and 21 are in the position indicated in Figs. 4 and 6. It will be observed that the camming portion 47 of locking member 23, which engages with the web portion 45 of the slidable actuating member 21 to cause the shoulder 48 to perform a locking function, prevents slidable member 21 from being moved relative to carriage 20 to the initial assembling position. Consequently disassembly thereof cannot accidentally occur.

Figure 5:
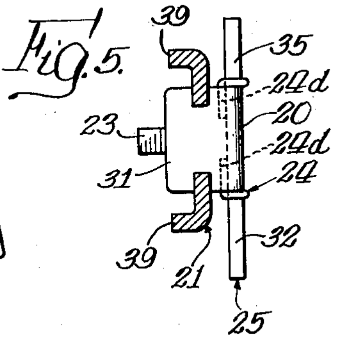
Fig. 5 is a sectional view taken on line 5—5 of Fig. 4.

The customary way of setting or adjusting cam 34 to a desired predetermined position comprises, first rotating shaft 12 and consequently treadle bar 19 to the desired position corresponding to a particular frequency or signal channel. After this the selector unit 18a which has been moved to the position shown in Figs. 4 and 6 in order to release cam 34, is moved to the left as viewed in Fig. 4 so that cam 34 engages with treadle bar 19 so that its surfaces 34a and 34b engage with portions 19a and 19b of treadle bar 19. It is obvious that during this adjusting operation the cam 34 must be free to rotate about pivot 52 to assume the desired position. It is essential, therefore, that no premature locking of cam 34 results before it has assumed the desired predetermined position. It is quite obvious that without additional structure the arrangement described thus far is likely to cause premature locking of cam 34 since web 45 of slidable member 21, when moved to the left by applying a force to push button 22, is likely to cause pivotal movement of locking bar 23 and frictional engagement of the locking shoulder 48 thereof with cam 34. In prior art arrangements various means such as friction washers or springs were provided to prevent such premature locking action. It should be remembered that a sufficient force must be applied to push button 22 during this adjusting operation to move carriage 20 and consequently to compress spring 38. Friction washer means must, therefore, be critically adjusted so that the holding force of the friction washer is sufficient to overcome the reactive force of normalizing spring 38. In accordance with the present invention a new and improved arrangement comprising the member 24 is provided to prevent premature locking of the cam, which arrangement requires no critical adjustment and which is foolproof in every respect. Member 24 which is a deformed wire member preferably formed of spring material, has a generally U-shaped configuration with the bight of the U 24a being bent at right angles with respect to the main leg portions 24b and 24c so that it may be wrapped around the web portion 55 defined by the portions 29a of L-shaped openings 29 in slide 20. The open end of member 24 is also provided with portions 24d bent at right angles to legs 24b and 24c of member 24 so that it may be wrapped around the T-shaped extension 31 as is best shown in Fig. 5. The legs 24b and 24c of the spring like member 24, which are adapted to extend along the surface of carriage 20, are provided with oppositely directed V-shaped detents 57 which extend laterally into the path of movement of legs 41 of slidable actuating member 21. When the selector unit is in the adjusted position with the parts 20 and 21 arranged as shown in Figs. 1, 2 and 7, the V-shaped detents 57 are to the right of the legs 41, as viewed in the drawings. When it is desired to unlock cam 34 by pulling on push button 22 and consequently on slidable actuating member 21, the legs 41 ride over the V-shaped detents 57 by causing the legs 24b and 24c to move toward each other momentarily so that the parts assume the positions indicated in Figs. 4 and 7. When it is desired to relock cam 34, pressure is applied to push button 22, causing cam 34 to move toward treadle bar 19. Premature locking of cam 34 is prevented by virtue of the fact that the V-shaped detents engage legs 41, as is clear from Figs. 4 and 6, thereby preventing further movement of slidable member 21 relative to carriage 20 until after cam 34 has firmly engaged with treadle bar 19 to insure proper positioning thereof. A slightly increased force on actuating member 21 will cause the legs 41 to slide over V-shaped detents 57, thereby permitting web 45 to engage camming surface 47 and cause relocking of cam 34 by frictional engagement with shoulder 48 on locking bar 23.

From the foregoing explanation it will be understood that in order to operate the tuning condenser 10 to the particular setting corresponding to the selector unit 18a, thereby to tune the receiver to the particular signal channel or station which corresponds to the selector unit, it is only necessary to depress the selector unit 18a inwardly relative to frame member 17 by finger manipulation of push button 22. Assuming that the treadle bar 19 and the cam element 34 occupy the positions shown in Fig. 2 of the drawings at the time this operation is started, the upper camming surface 34a of the cam element 34 is initially brought into engagement with the angle portion 19a of treadle bar 19 as the selector unit 18a is moved to the left as viewed in Fig. 2. During continued movement of the selector unit the cam element 34 rotates the treadle bar 19 and the shaft 12 in a counterclockwise direction until the lower angle portion 19b engages with cam surface 34b, at which time movement of the selector unit and the treadle bar is arrested. This represents the home or tuned position of the selector unit. This action of the unit is similar for any relative positioning of treadle bar 19 and the cam 34. The engagement of the corresponding portions on the treadle bar and the cam nearest together at the start of actuation of the selector unit serves to rotate the treadle bar 19 in a direction and to a position at which the face edges of the cam 34a and 34b are both in engagement with the co-responding portions 19a and 19b of the treadle bar 19. In other words, the selector unit is always pushed inwardly to the same longitudinal position when the condenser is in a tuned position and the treadle bar and cam are in flush engagement at this position, but at such tuned position the angular position of the treadle bar and cam faces will vary in accordance with the particular frequency tuned in with the condenser. During this normal operation of the unit it is to be understood that the selector unit is in its retracted position as shown in Figs. 1, 2, 3 and 7, the cam member 34 being locked in a relatively fixed position with respect to carriage 20 by means of locking bar 23.

In the event that the adjustable element or cam 34 is changed from a setting corresponding to a particular station to a different setting wherein it corresponds to a different station, then a pulling force is applied to push button 22 to move slidable actuating member 21 to the right as viewed in Fig. 2. Since carriage 20 is held stationary by virute of shoulder 35 engaging with frame 17, slidable member 21 is moved to the position indicated in Figs. 4 and 6 so that web 45 is out of engagement with the camming portion 47 of locking member 23, and as a consequence thereof frictional engaging portion 48 is free from cam 34, which in turn is freely adjustable about pivotal support 52. The condenser unit 10 is now tuned to the desired station by rotating shaft 15, and treadle bar 19 is then positioned in accordance with the new station setting. With the selector unit 18a in the position indicated in Figs. 4 and 6, manual pressure is applied to push button 22 and by virtue of V-shaped detents 57 engaging with legs 41 of slidable member 21, carriage 20 and slidable member 21 move as a unit to the left against the pressure of normalizing spring 38. When the adjustable element or cam 34 engages treadle bar 19, cam 34, which is freely rotatable on pivot 52, assumes an angular position which corresponds to the position of treadle bar 19, which remains immovable and in the tuning position obtained by manipulation of the tuning knob 16. When the camming surfaces 34a and 34b firmly engage with the extensions 19a and 19b of treadle bar 19, the movement of carriage 20 is stopped due to the fact that the axis of the treadle bar and the longitudinal axis of the selector unit 18a are in the same horizontal plane so that continued application of pressure on push button 22 effects a linear movement only of slidable member 21. When a sufficient force is applied to push button 22, legs 41 which are in engagement with V-shaped detents 57 of member 24 are moved toward each other momentarily whereupon relative movement of slidable member 21 and carriage 20 can occur until web portion 45 has moved along camming surface 47 to the position indicated in Fig. 7, thereby causing locking surface 48 firmly to engage cam 34. During this adjusting operation it is obvious that the operator need only use one hand and furthermore, no additional tools or equipment are necessary to make the desired adjustments.

Upon completion of the adjusting operation the normalizing spring 38 causes the selector unit to be moved to the position indicated in Figs. 1 and 2. Later actuation of the selector unit will rotate treadle bar 19 from any position which it might have to a position corresponding with the angular position which adjustable element or cam 34 has.

From the above explanation it will be understood that the control unit embodies a construction which is very simple and which, except for the member 24 and the pin 52, may be made from die stampings which are relatively inexpensive. Furthermore, with the arrangement described, manufacturing operations are greatly simplified, particularly by virtue of the ease of assembly. Furthermore, by means of the present invention a positive and reliable arrangement is provided for preventing premature locking of the adjustable element during an adjusting operation, yet requires very little force to be applied by the operator. Furthermore, by virtue of the simplicity of the selector unit described above which embodies complete elimination of any critical adjustments of any kind whatever, there is small likelihood that the selector unit will get out of order. It should be understood that although the present invention has been described as applied to a radio receiver it will be understood that it is also applicable to a radio transmitter.

It will be apparent to those skilled in the art that the present invention is not limited to the particular construction shown, but various changes and modifications may be made without departing from the spirit and scope of the present invention. Accordingly it is aimed in the appended claims to cover all such changes and modifications as fall within the true spirit and scope of the present invention.

I claim:

1. In a tuning device for a radio receiver or transmitter, a tuning slide structure including a main slide member having an adjustable cam pivotally mounted thereon, a locking member supported on said main slide member for applying pressure to clamp said cam against said main slide member, slidable means carried on said main slide member for causing said locking member to release or clamp said cam in a fixed position relative to said main slide member, and means for preventing premature locking of said cam during an adjusting operation thereof comprising a member formed of spring wire supported on said main slide member.

2. In a tuning mechanism for a radio receiver or transmitter, a tuning slide structure including a main slide member having an adjustable device pivotally mounted thereon, a locking member supported on said main slide member for applying pressure to clamp said device against said main slide member, slidable means carried on said slide structure for causing said locking member to release or clamp said device, and a locking member to release or clamp said device, a deformed wire member mounted on said tuning slide structure and yieldably engageable with said slidable means for retaining the same during an adjusting operation of said adjustable device and preventing premature clamping thereof.

3. Tuning apparatus for a radio receiver having movable control means, selector means for moving said control means to a predetermined control position including a carriage, a linearly movable actuating member supported in dovetailed relation with said carriage and slidable relative thereto, an adjustable element for engaging said movable control means supported on said carriage, an L-shaped locking member having a hooked portion supported on said carriage intermediate said adjustable element and said actuating member, said locking member having a shoulder portion thereof frictionally engageable with said adjustable element to lock the same in an adjusted position, a tapered camming portion on said locking member engageable with a portion of said actuating member whereby upon linear sliding movement of said actuating member in one direction relative to said carriage frictional locking of said element in an adjusted position is obtained, and means for preventing premature locking of said element during an adjusting operation.

4. Tuning apparatus for a radio receiver having movable control means, selector means for moving said control means to a predetermined control position including a carriage having an aperture therein, a linearly movable actuating member slidably supported with respect to said carriage, an adjustable cam for engaging said movable control means supported on said carriage, an L-shaped locking member having a hooked portion inserted in said aperture in said carriage intermediate said cam and said actuating member, said locking member having a shoulder portion thereof frictionally engageable with said cam to lock the same in an adjusted position, a tapered camming portion on said locking member engageable with a web portion of said actuating member whereby upon linear sliding movement of said actuating member in one direction relative to said carriage frictional locking of said cam in an adjusted position is obtained, and means for preventing premature locking of said cam during an adjusting operation.

5. Tuning apparatus for a radio receiver having movable control means, selector means for moving said control means to a predetermined control position including a carriage, a linearly movable actuating member supported in dovetailed relation with said carriage and slidable relative thereto, an adjustable element for engaging said movable control means supported on said carriage, a locking member pivotally supported on said carriage intermediate said adjustable element and said actuating member, means on said locking member frictionally engageable with said adjustable element to lock the same in an adjusted position, a tapered camming portion on said locking member engageable with a portion of said actuating member whereby upon linear sliding movement of said actuating member in one direction relative to said carriage, frictional locking of said element in an adjusted position is obtained, and means including a wire member having a pair of movable leg members for preventing premature locking of said element during an adjusting operation.

6. Tuning apparatus for a radio receiver having movable control means, selector means for moving said control means to a predetermined control position including a plurality of relatively movable members, an adjustable element on one of said members for engaging said movable control means, a locking lever supported on one of said members and engageable by the other of said members so that in one predetermined relative position of said members said lever locks said adjustable element in an adjusted position while in another predetermined relative position of said members said element is free to be adjusted, said selector means being so constructed and arranged that operation thereof to move said control means is similar to operation thereof to cause relative movement of said members to lock said element during an adjusting operation of said element, means for preventing premature locking of said element during an adjusting operation until said element engages said control means comprising a wire member formed into a somewhat U-shaped configuration including means on the legs of said U-shaped wire member for interfering with the relative movement of said members.

7. Tuning apparatus for a radio receiver having movable control means, selector means for moving said control means to a predetermined control position including a carriage, a linearly movable actuating member supported in dovetailed relation with said carriage and slidable relative thereto, an adjustable element for engaging said movable control means supported on said carriage, an L-shaped locking member having a hooked portion supported on said carriage intermediate said adjustable element and said actuating member, said locking member having a shoulder portion thereof frictionally engageable with said adjustable element to lock the same in an adjusted position, a tapered camming portion on said locking member engageable with a portion of said actuating member so that upon linear sliding movement of said actuating member in one direction relative to said carriage frictional locking of said element in an adjusted position is obtained, and a wire member including V-shaped detents thereon engageable with said actuating member to limit relative movement between said actuating member and said carriage whereby premature locking of said element during an adjusting operation is prevented.

8. In a tuning device for a radio receiver having a rotatable tuning shaft, a treadle associated with said shaft, selector means for moving said tuning shaft to a predetermined station setting including a plurality of relatively movable members, an adjustable cam on one of said members for engaging said treadle to cause rotation of said shaft, locking means supported on one of said members and engageable by the other of said members so that in one predetermined relative position of said members said locking means locks said cam in an adjusted position while in another predetermined relative position of said members said cam is free to be adjusted, said selector means being so constructed and arranged that operation thereof to rotate said shaft is similar to operation thereof to cause relative movement of said members to lock said cam during an adjusting operation thereof, means for preventing premature locking of said cam during such adjusting operation until said cam engages said treadle comprising a wire member including interference deformations formed thereon interfering with the relative movement of said members during an adjusting operation until after said cam has fully engaged said treadle.

9. In an automatic tuning device for a radio receiver having a rotatable tuning shaft, selector means including a manually operated push button for rotating said shaft to a predetermined control position including a plurality of relatively movable members, engageable means on said shaft, an adjustable element on one of said members for engaging said engageable means, a locking lever supported on one of said members and engageable by the other of said members so that in one predetermined relative position of said members said lever locks said adjustable element in an adjusted position while in another predetermined relative position of said members said element is free to be adjusted, said selector means being so constructed and arranged that operation thereof to rotate said shaft is similar to operation thereof to cause relative movement of said members to lock said element during an adjusting operation of said element, and means for preventing premature locking of said element during an adjusting operation until said element engages said engageable means comprising a spring wire of U-shaped configuration supported on one of said members including means thereon for interfering with the movement of the other of said members.

10. In an automatic tuning device for a radio receiver having a rotatable tuning shaft, selector means for rotating said shaft to a predetermined control position including a plurality of relatively movable members, engageable means on said shaft, an adjustable element on one of said members for engaging said engageable means, a locking lever supported on one of said members and engageable by the other of said members so that in one predetermined relative position of said members said lever locks said adjustable element in an adjusted position while in another predetermined relative position of said members said element is free to be adjusted, said selector means being so constructed and arranged that operation thereof to rotate said shaft is similar to operation thereof to cause relative movement of said members to lock said element during an adjusting operation of said element, and means for preventing premature locking of said element during an adjusting operation until said element engages said engageable means comprising a spring wire of U-shaped configuration supported on one of said members including V-shaped detents thereon for interfering with the movement of the other of said members.

11. In an automatic tuning device for a radio receiver having a rotatable tuning shaft, selector means including a manually operated push button for rotating said shaft to a predetermined control position including a plurality of relatively movable members, engageable means on said shaft, an adjustable element on one of said members for engaging said engageable means, a locking lever supported on one of said members and engageable by the other of said members so that in one predetermined relative position of said members said lever locks said adjustable element in an adjusted position while in another predetermined relative position of said members said element is free to be adjusted, said selector means being so constructed and arranged that operation thereof to rotate said shaft is similar to operation thereof to cause relative movement of said members to lock said element during an adjusting operation of said element, means for preventing premature locking of said element during an adjusting operation until said element engages said engageable means comprising a spring wire of U-shaped configuration supported on one of said members including a V-shaped detent thereon for interfering with the movement of the other of said members, and means for momentarily moving said detent out of its interfering position to permit relative movement of said members to cause said locking lever to lock said element after said element has engaged said engageable means.

12. In control apparatus having movable control means, mechanism for moving said control means including in combination a carriage, an adjustable member mounted thereon, a clamping member engaging said adjustable member, means on said carriage acting on said clamping member and manually movable with a push-pull movement to move said clamping member and clamp or release the adjustable member, and a spring operatively connected with said manually movable means having detent projections thereon to retain said movable means in a position with said clamping member released during the setting of the adjustable member but yieldable to permit movement of said movable means past said detent projections to actuate the clamping member to clamp the adjustable member on the carriage.

13. In control apparatus having movable control means, mechanism for moving said control means including in combination a carriage, an adjustable element mounted thereon, a clamping member to clamp said element in an adjusted position, push-button means operatively connected to said clamping member and adapted to be pulled out to release the clamping member from said element and pushed in to clamp the same, and spring means on said mechanism having detent projections for yieldingly retaining said push-button means in a position while said element is being adjusted such as to prevent movement of the clamping member and premature clamping of said element, said spring means being yieldable to permit movement of said push-button means past said detent projections when said element is fully adjusted for enabling said clamping member to clamp said element.

ALEXANDER W. PLENSLER.

REFERENCES CITED

The following references are of record in the file of this patent:

UNITED STATES PATENTS

| Number | Name | Date |
|---|---|---|
| 2,301,090 | Teaf | Nov. 3, 1942 |
| 2,310,003 | Wells | Feb. 2, 1943 |